(12) United States Patent
Nigg et al.

(10) Patent No.: US 6,779,667 B2
(45) Date of Patent: Aug. 24, 2004

(54) MODULAR CARRIER FOR SEMICONDUCTOR WAFER DISKS AND SIMILAR INVENTORY

(75) Inventors: James Nigg, Howard Lake, MN (US); Ralph Henderer, Excelsior, MN (US)

(73) Assignee: Entegris, Inc., Chaska, MN (US)

( * ) Notice: Subject to any disclaimer, the term of this patent is extended or adjusted under 35 U.S.C. 154(b) by 214 days.

(21) Appl. No.: 10/228,828

(22) Filed: Aug. 27, 2002

(65) Prior Publication Data

US 2003/0038056 A1 Feb. 27, 2003

Related U.S. Application Data

(60) Provisional application No. 60/315,262, filed on Aug. 27, 2001.

(51) Int. Cl.[7] .............................................. B65D 85/48
(52) U.S. Cl. ...................................... 206/711; 414/940
(58) Field of Search ................................ 206/454, 701, 206/710, 711, 712; 211/41.18; 414/217, 935, 940; 118/500, 728

(56) References Cited

U.S. PATENT DOCUMENTS

| 5,788,082 | A | | 8/1998 | Nyseth |
|---|---|---|---|---|
| 6,010,008 | A | | 1/2000 | Nyseth et al. |
| 6,105,782 | A | | 8/2000 | Fujimori et al. |
| 6,382,419 | B1 | | 5/2002 | Fujimori et al. |
| 2001/0040116 | A1 | * | 11/2001 | Hyobu et al. ............... 206/711 |
| 2003/0002961 | A1 | * | 1/2003 | Davis et al. ............. 414/217.1 |

* cited by examiner

*Primary Examiner*—David T. Fidei
(74) *Attorney, Agent, or Firm*—Patterson, Thuente, Skaar & Christensen, P.A.

(57) ABSTRACT

A modular carrier system uses a shell portion to house semiconductor wafer disks or similar inventory. The modular carrier system uses an external frame with accessories attached to the frame so that multiple configurations of accessories are possible with each shell portion and the accessories can be recycled when the shell portion is disposed.

5 Claims, 3 Drawing Sheets

MODULAR CARRIER FOR SEMICONDUCTOR WAFER DISKS AND SIMILAR INVENTORY

RELATED APPLICATIONS

This application claims the benefit of U.S. Provisional Application No. 60/315,262, filed on Aug. 27, 2001, which is hereby incorporated herein by reference.

FIELD OF THE INVENTION

The present invention relates to a container or carrier configured to hold semiconductor wafer disks, film frames, or similar inventory. In particular, the present invention relates to a versatile modular carrier or container system for housing and precisely positioning semiconductor wafer disks, film frames, or similar inventory during a manufacturing process, which modular carrier system includes an external frame that is attachable to and detachable from a shell portion and to which a manufacturing process accessory is connected.

BACKGROUND OF THE INVENTION

Processing wafer disks into integrated circuit chips involves numerous steps during which the disks are repeatedly processed, stored, and transported. Because of the delicate mature of these disks as well as their high value, it is important for them to be properly protected from damage or particulation and other contamination throughout the manufacturing process. A purpose of wafer carriers is to provide this kind of protection.

Carriers come in a variety of shapes and sizes for meeting a variety of needs. Common types of carriers are SMIFs, FOUPs, FOSBs, and film frame carriers. These and other types of carriers or shippers or pods may be configured to receive semiconductor wafers disks, film frames, and similar electronic component inventory. The carriers generally are constructed and arranged to be sealable enclosures having a main body and a door to cover an opening or aperture in the main body through which the disks are inserted into and removed from the interior of the enclosure.

Because much of the manufacturing process utilizing semiconductor wafer disks and similar inventory is automated, carriers provide features or accessories for accommodating and optimizing automated processes as well as other processes. These accessories include machine interfaces, guide plates, kinematic couplings, robotic flanges, and various types of tagging, tracking, and information providing means. Moreover, since carriers are often manually handled as well, manual handles are required. U.S. Pat. No. 6,216,87 discloses a wafer carrier for use in automated semiconductor component handling, hereby incorporated by reference. U.S. Pat. No. 5,944,194 discloses a substrate carrier and U.S. Pat. No. 6,164,664 discloses a kinematic coupling for adjoining a carrier pod with a surface, both of which are also hereby incorporated by reference.

A disadvantage of previous carriers is that, because accessories are attached to the enclosure for the disks, a manufacturing process must have numerous carriers that are each designed for a specific purpose or manufacturing process, or have a more "universal" carrier having numerous build on accessories, some or many of which are not used for a particular manufacturing process. As a consequence of either of these, costs are higher than necessary, extra accessories during a process step may cause inconveniences, and accessories are disposed with enclosures when the enclosures become useless. Other examples of carriers possessing features that might not be necessary during certain processing steps are U.S. Pat. No. 5,711,427 and U.S. Pat. No. 5,785,186.

Therefore, it would be advantageous to have a carrier system whereby accessories were attachable to and detachable from the enclosure and in such predetermined positions that were appropriate for and conducive to automated manufacturing processes.

SUMMARY OF THE INVENTION

A modular carrier system uses a shell portion to house semiconductor wafer disks or similar inventory. The modular carrier system uses an external frame with accessories attached to the frame so that multiple configurations of accessories are possible with each shell portion and the accessories can be recycled when the shell portion is disposed.

An object and advantage of the preferred embodiments of the present invention is to provide a wafer carrier and method for assembling the carrier that fulfills the needs outlined above.

Another object and advantage of the preferred embodiments of the present invention is to provide a shell portion that can function as a shipper and that may easily and inexpensively have automated features and manual handles added thereto to make the carrier more versatile and function in a manufacturing process.

Another object and advantage of the preferred embodiments of the present invention is to provide a modular wafer carrier having lower assembly costs.

Another object and advantage of the preferred embodiments of the present invention is to provide a modular wafer carrier that cooperates with existing fabrication machinery and/or automated equipment.

Another object and advantage of the preferred embodiments of the present invention is that the shell portion may be discarded after a desired number of uses while retaining the automated features and manual handles.

Preferred embodiments of the modular carrier system for housing semiconductor wafer disks and similar inventory comprise a shell portion, an external frame and at least one manufacturing process accessory. The shell portion further comprises a main body having an exterior surface, an interior, and an aperture through which disks may be inserted into or removed from the interior of the main body, and a door cooperating with the main body, whereby an open position and a closed position of the door are defined with respect to the main body so that disks may be inserted into and removed from the interior of the main body when the door is in the open position and the aperture is sealed shut when the door is in the closed position. The external frame may be known by several names, such as a skin, exoskeleton, saddle, adaptor. It at least partially surrounds or envelopes the shell portion in a predetermined configuration so that the carrier system cooperates with and can enhance automated manufacturing processes or fabricating systems. By using a frame, at least one manufacturing process accessory can be appropriately positioned on and connected to the external frame so that it may be used in the appropriate manufacturing process step and recycled instead of following the shell portion or being disposed with the shell portion. Accessories may be permanently attached to a frame or may be attachable to and detachable from the frame. The frame is attachable to and detachable from the shell portion.

Accessories may also be attached to the shell portion to provide a user with whatever the user feels will create an optimum arrangement.

In operation, a method of manufacturing semiconductor wafer disks and similar inventory comprises providing a modular carrier system comprising a shell portion, the shell portion having a door and a main body having an aperture and an interior, an external frame, and at least one manufacturing process accessory; attaching the external frame to the shell portion; connecting the at least one manufacturing process accessory to the external frame; providing at least one semiconductor wafer disk; inserting the at least one disk into the interior of the main body; and sealing the aperture of the main body with the door. Those skilled in the art are aware that these steps may be performed as effectively in other orders as well.

DETAILED DESCRIPTION OF THE PREFERRED EMBODIMENT

Figure 1:
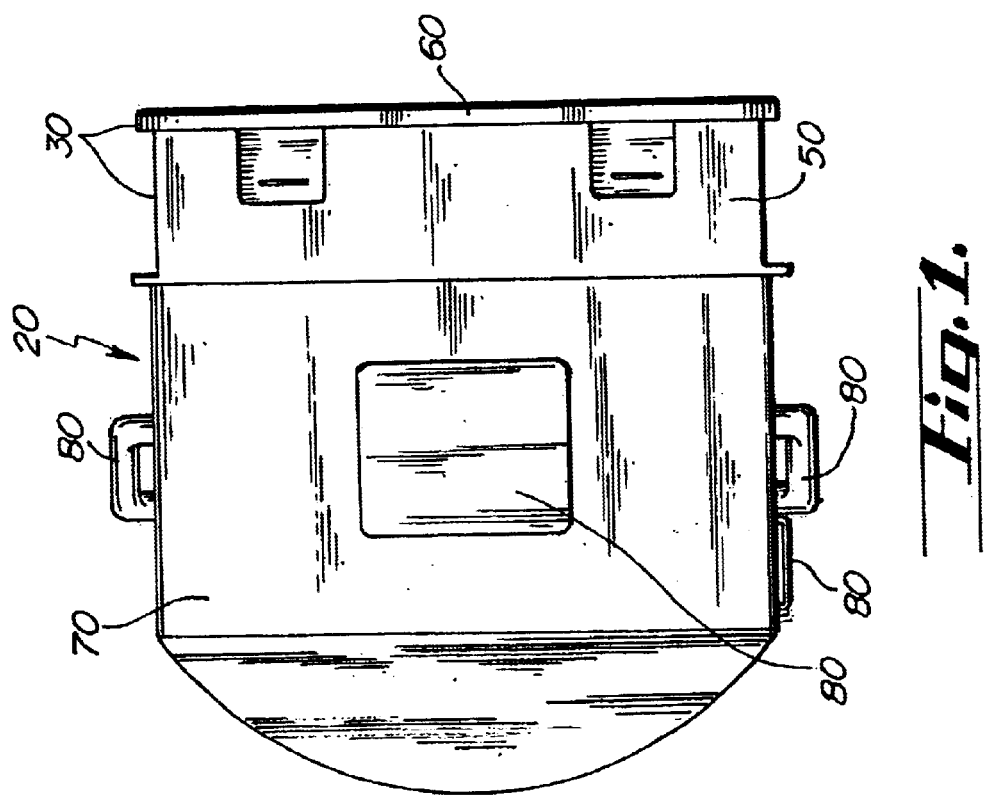
FIG. 1 is a top plan view of the preferred embodiment of a modular carrier system in accordance with the present invention.
Figure 2:
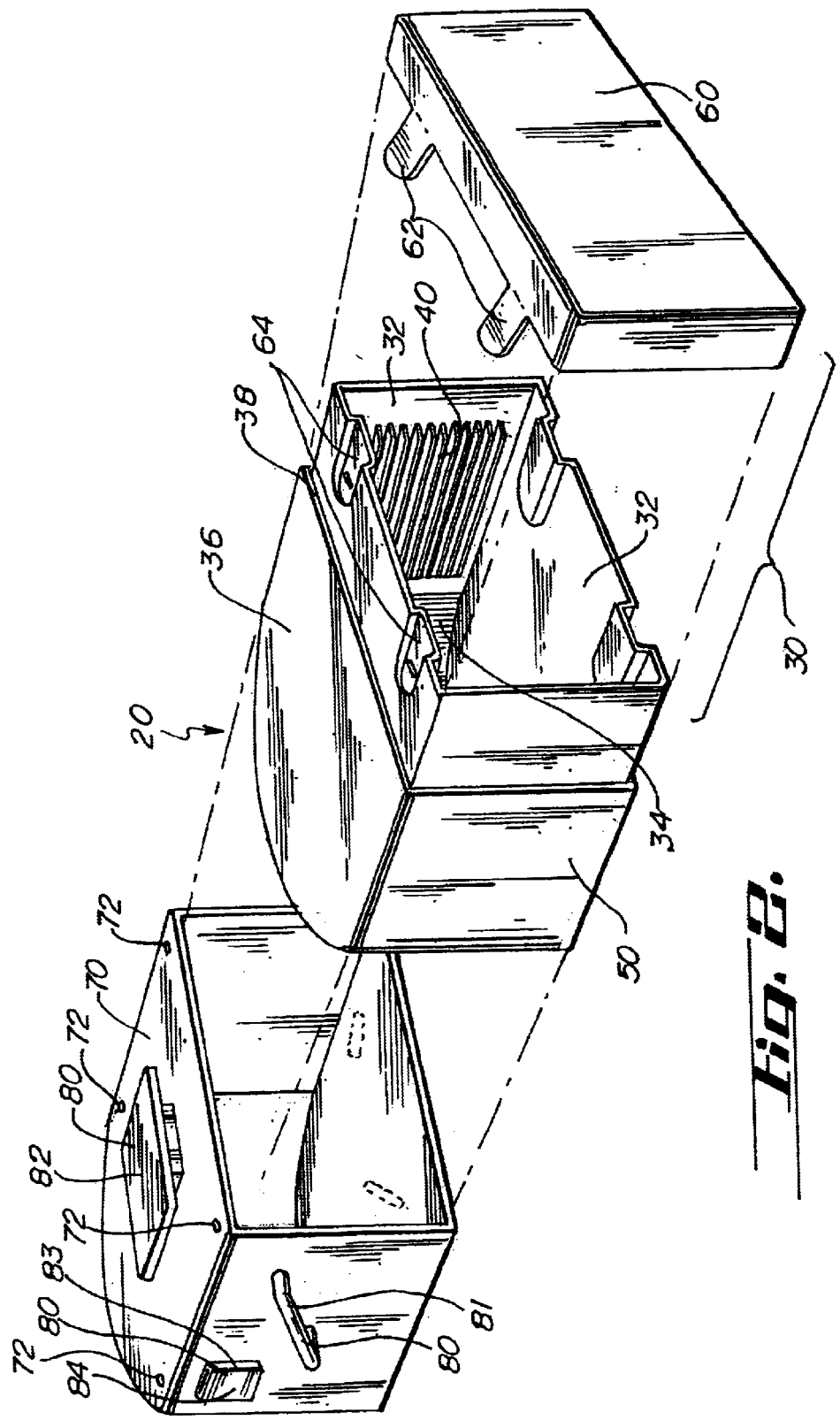
FIG. 2 is an exploded view of the modular carrier system in FIG. 1.

The preferred embodiment relates to a modular carrier system in accordance with the present invention. The carrier system may be used to house and protect semiconductor wafer disks, film frames, and similar inventory. Thus, the scope of the present invention encompasses the entire range of possible substrates that can be carried or shipped in pod-like containers. As shown in FIGS. 1–2, the modular carrier system 20 is comprised of a shell portion 30, an external frame 70, and at least one manufacturing process accessory 80. The shell portion 30 further comprises a main body 50 and a door 60. The main body has an interior surface 32, an interior 34, an exterior surface 36, and a ridge 38 on the exterior surface 36. The interior 34 of the main body 50 is constructed and arranged so that inventory such as wafer disks or film frames can be are housed in the interior 34 in a secure manner and separated from each other. In the preferred embodiment, for example, this is accomplished using supporting dividers 40 formed on the interior surface 32, which support the inventory in a horizontal manner.

The door or cover 60 of the shell portion 30 is attached to the main body 50 and has an open position and a closed position relative to the main body 50. The door 60 is configured and arranged to seal the interior 34 of the main body 50 from the external environment when the door 60 is in the closed position and allow inventory to be placed into or removed from the main body 50 when the door 60 is in the open position. The door 60 has a plurality of first latch components 62 that are constructed and arranged to mate with a plurality of second latch components 64 on the main body 50 for attaching the door 60 to the main body 50. Those skilled in the aware that there are several different kinds of mechanisms that can be used to attach the door to the main body without departing from the spirit of the present invention.

The external frame 70 may be constructed as a unitary piece or it may be assembled from a plurality of pieces held together by fasteners 72. The external frame 70 is constructed and arranged to receive one or more manufacturing process accessories or features 80, such as manual handles 81, machine interfaces, guide plates, kenematic couplings, robotic flanges 82, and various types of tagging, tracking, and information providing means 83. The information providing means 83 may include radio frequency tags. A storage pocket 84 may be provided on the external frame 70 for containing the information providing means 83. Those skilled in the art should be aware that many other accessories 80 may be provided in many different positions on the external frame 70, depending on the needs during the various manufacturing process steps. Each of these accessories 80 may be selectively attached or detached from the external frame 70 for handling the carrier 20 during a manufacturing process. Alternatively, one or more accessories may be permanently attached to the external frame 70 or unitarily configured therewith.

The external frame 70 is configured to be attached to and detached from the shell portion 30. The external frame 70 is securely attached to the shell portion 30 so that contents of the shell portion 30 may be properly registered or aligned during processing on automated equipment. The external frame 70 permits a plurality of shell portions 30 to be used in the semiconductor production process without having to utilize an identical number of accessories 80. By reducing the need to provide all required features and accessories 80 on the shell portion., the shell 30 may be manufactured at a reduced cost. The use of a separate external frame 70 having desirable accessories 80 may also reduce manufacturing costs by reducing the cost of replacing high cost shipping containers having all the necessary accessories 80.

The shell portion 30 may be attached to the external frame 70 by conventional fastening means such as an interference or friction fit as in FIG. 2, screws, bolts, or snap-in fastening means. Examples of snap-in fastening means for wafer carriers are disclosed in U.S. Pat. No. 6,038,186, which is hereby incorporated by reference.

Figure 3:
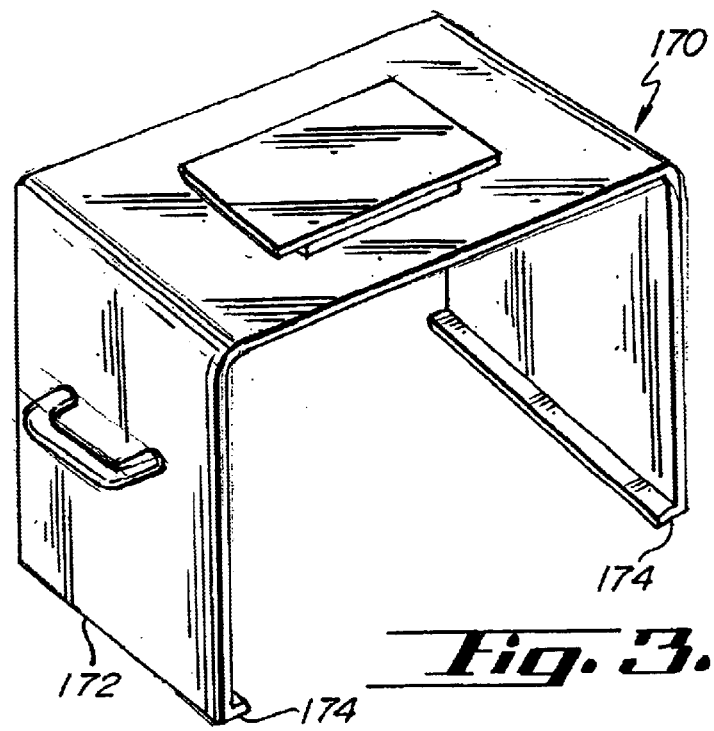
FIG. 3 is a perspective view of an alternative embodiment of an external frame in accordance with the present invention.
Figure 4:
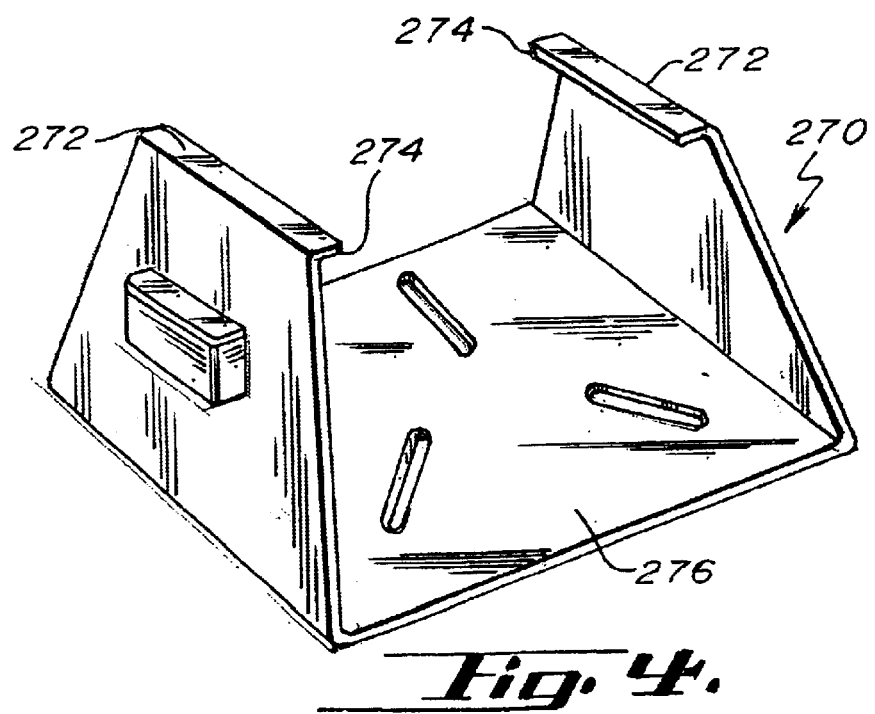
FIG. 4 is a perspective view of a second alternative embodiment of an external frame in accordance with the present invention.

The exterior surface of the shell 36 may have a lip or ridge, knobs or tabs, or other raised structure 38 to cooperate with the external frame 70 to position the shell portion 30 within the external frame 70. The exterior surface 36 of the shell portion 30 may be provided with a kinematic coupling or it may be provided with a guide plate as shown in FIG. 3 of U.S. Pat. No. 6,216,874. In such a case, the shell portion 30 may have three kinematic coupling ribs integral therewith as shown in FIG. 4 of this same patent. The shell 30 may be molded of a suitable plastic for semiconductor production, such as a polycarbonate. The external frame 70 may be constructed of aluminum. It may also be constructed of a carbon filled polycarbonate or PEEK, or other suitable material.

Figure 5:
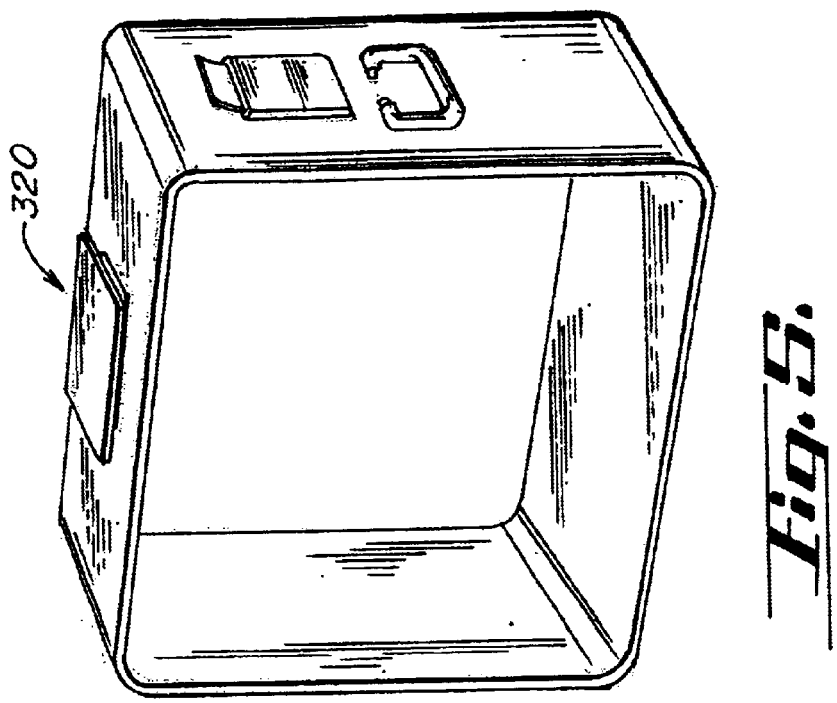
FIG. 5 is a perspective view of a third alternative embodiment of an external frame in accordance with the present invention.

FIGS. 3–5 show alternative embodiments of the external frame. The external frame 170 in FIG. 3 is generally has an inverted U-shape and at least partially covers three sides of the shell portion when it is properly attached. The bottom edges 172 have guides, ledges, or hooks 174 for holding the external frame 170 to the shell portion. The external frame 270 in FIG. 4 is also generally U-shaped and at least partially covers three sides of the shell portion when it is properly attached. The top edges 272 are provided with guides, ledges, or hooks 274 for holding the external frame 270 to the shell portion. The bottom surface 276 of the external frame 270 has a plurality of apertures to allow access to a kinematic coupling on the shell portion. The external frame 370 in FIG. 5 is shaped like a rigid strap or encircling band. Another possible shape or configuration might be a sleeve.

The door may be affixed to the main body in cooperation with external frame or independently of the external frame. The door is affixed to the main body by positioning the door over the aperture of the main body and securing the latches so that the aperture is sealed shut.

Although the preferred embodiment of the modular carrier system has been described herein, numerous changes and variations can be made and the scope of the invention is intended to be defined by the claims herein.

That which is claimed:

1. A modular carrier system for housing semiconductor wafer disks and similar inventory, the modular carrier system comprising:

a plurality of shell portion, each comprising a main body a door, each main body having an exterior surface, an interior, and an aperture through which disks may be inserted into and removed from the interior of the main body, each door cooperating with the main body, whereby an open position and a closed position of the door are defined with respect to the main body so that disks may be inserted into and removed from the interior of the main body when the door is in the open position and the shell portion forms a sealed enclosure when the door is in the closed position;

a plurality of external frames, each configured to at least partially envelope the shell and to be removably attachable thereto, the plurality of external frames having different configurations amongst the plurality; and at least one manufacturing process accessory connected to each external frame, whereby the plurality of external frames having different configurations are each assemblable with each shell portion.

2. The modular carrier system of claim 1, wherein the different configurations of the frame is selected from a group of configurations consisting of an open container, a sleeve, a U-shaped mounts and at least one encircling band.

3. The modular carrier system of claim 1, wherein the external frame is made of aluminum.

4. A method of manufacturing semiconductor wafer disks and similar inventory, comprising:

a) providing a modular carrier system comprising a plurality of shell portions, the shell portions each having a door and a main body, the main body having an interior and an aperture, the main body and door together forming a sealed enclosure, a plurality of external frame, and a plurality of manufacturing process accessories;

b) removably attaching external frames to the shell portions wherein each frame envelopes the respective shell portion;

c) providing at least one manufacturing process accessory to each external frame;

d) utilizing the plurality of shell portions and attached external frames to hold semiconductor wafer disks or similar inventory; and e) disposing of the shell portions and reutilizing the external frames on additional shell portions.

5. A method of manufacturing semiconductor wafer disks and similar inventory, comprising:

a) providing a plurality of shell portions, each having a main body and a door sealable therewith to form a sealed enclosure;

b) providing a plurality of frames with differently configured manufacturing accessories, the frames each extendable around at least three sides of each shell portion enveloping the shell portion;

c) selecting a specifically configured frame for a specific shell portion;

d) removably attaching the selected frame to the specific shell portion;

e) utilizing the shell portion and frame;

f) separating the frame from the shell portion; and g) reutilizing the frame on a different shell portion.

* * * * *